United States Patent [19]

Ueno

[11] Patent Number: 4,656,109
[45] Date of Patent: Apr. 7, 1987

[54] LAYERED SOLID STATE COLOR PHOTOSENSITIVE DEVICE

[75] Inventor: Masakazu Ueno, Kanagawa, Japan

[73] Assignee: Fuji Electric Co., Ltd., Kawasaki, Japan

[21] Appl. No.: 777,506

[22] Filed: Sep. 19, 1985

[30] Foreign Application Priority Data

Sep. 19, 1984 [JP] Japan ................................. 59-195988

[51] Int. Cl.$^4$ .............................................. G01J 3/50
[52] U.S. Cl. ........................................ 430/46; 430/57; 356/434
[58] Field of Search ...................... 430/46, 57, 67, 85, 430/94; 356/434

[56] References Cited

U.S. PATENT DOCUMENTS 4,228,231 10/1980 Kaukeinen et al. .................... 430/46
4,490,454 12/1984 Misumi et al. ......................... 430/57

Primary Examiner—John L. Goodrow
Attorney, Agent, or Firm—Finnegan, Henderson, Farabow, Garrett & Dunner

[57] ABSTRACT

A color photosensitive device includes a transparent base plate and a lamination of alternate layers of transparent conductive films and photoelectric conversion layers. The photoelectric conversion layers are sensitive to light of increasing wavelength as the distance from the base plate increases. The photoelectric conversion layers comprise amorphous silicone and the transparent conductive films comprise an oxide of indium, tin, or the like.

6 Claims, 4 Drawing Figures

LAYERED SOLID STATE COLOR PHOTOSENSITIVE DEVICE

BACKGROUND OF THE INVENTION

1. Field of the Invention

The present invention relates to a color photosensitive device using semiconductor photoelectric conversion layers made of, for example, amorphous silicone.

2. Description of the Prior Art

Amorphous silicone has received much attention as a semiconductor material in place of monocrystal silicone. Particularly, a photoelectric conversion element of amorphous silicone has been practically used in a solar cell, various kinds of sensors, etc.

A color photosensitive device using amorphous silicone has been proposed as disclosed, for example, in Japanese Patent Publication No. 125869/1983. In this device, three photosensors which are respectively sensitive to blue, green, and red light are formed on the same substrate and a cross-section thereof is shown in FIG. 2. A first layer of transparent conductive films 21, 22 and 23, a layer 3 of semiconductor photoelectric conversion material, including a p-i-n junction of amorphous silicone, and a third layer of metal electrodes 41, 42 and 43 are successively formed on one surface of a glass plate 1. The other surface of the glass plate 1 is covered with regions constituting a red filter 51, a green filter 52, and a blue filter 53. In such an arrangement, information of colors, that is, red, green and blue, with respect to light 6 can be obtained. Therefore, the arrangement operates as a color photoelectric device.

In this arrangement, however, it is impossible to reduce the areas of the respective color sensors disposed on a plane of the substrate beyond a certain value resulting in a problem of color offset. Further, the area per one picture element is large, and, therefore, resolution is deteriorated in the case where a plurality of such sensors are used side by side, for example, in an optical reader for a color facsimile, or the like.

OBJECTS AND SUMMARY OF THE INVENTION

An object of the present invention is to eliminate the disadvantages in the prior art as described above.

Another object of the present invention is a color photosensitive device in which no color offset is generated.

A further object of the present invention is a color photosensitive device with high resolution.

To attain the above objects, according to the present invention, a color photosensitive device comprises a plurality of photoelectric conversion layers laminated with transparent conductive films interposed therebetween, and arranged such that photoelectromotive force generated by one of the conversion layers through photoelectric conversion of light in a shortwave region among light transmitted through another conversion layer adjacent to the one conversion layer at a light incident side thereof is taken out through one of the transparent conductive films contacting the one conversion layer. That is, the conversion layers are located at the same position relative to incident light and are successively exposed to light in a certain wavelength band ranging from shortwave to longwave so as to function as a color photosensitive device. In order to be exposed to light in a predetermined wavelength region, the semiconductor photoelectric conversion layers are arranged to have thicknesses which are successively thicker when viewed from the incident side of the light. Alternatively, the intermediate transparent conductive films interposed between conversion layers are arranged to have thicknesses which are successively thicker when viewed from the incident side of light so that the reflection spectra of the respective films gradually shift to the longwave side.

BRIEF DESCRIPTION OF THE DRAWINGS

The present invention will be apparent from the following detailed description taken in conjunction with the accompanying drawings

DETAILED DESCRIPTION OF THE PREFERRED EMBODIMENT

Figure 1:
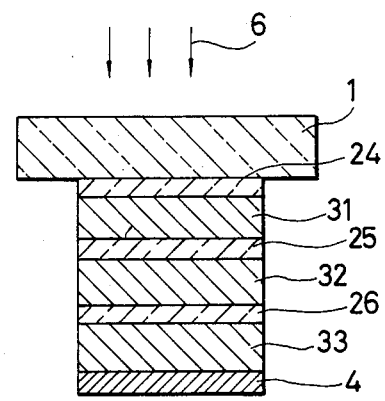
FIG. 1 is a cross-section showing an embodiment of the color photosensitive device according to the present invention.
Figure 2:
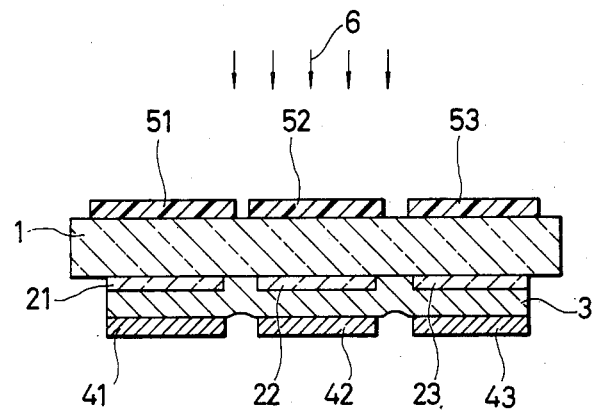
FIG. 2 is a cross-section showing a conventional color photosensitive device.

Referring to the drawings, an embodiment of the color photosensitive device according to the present invention will now be described.

FIG. 1 is a cross-section showing an arrangement of an embodiment of the present invention. Transparent conductive films 24, 25 and 26, and semiconductor photoelectric conversion layers 31, 32 and 33 are alternately laminated and a metal electrode 4 is formed on a surface of the layer 33. Each of the photoelectric conversion layers 31, 32 and 33 includes a p-i-n junction of amorphous silicone and can be easily produced by a known glow discharge separation method. The respective thicknesses of the semiconductors of the photoelectric conversion layers 31, 32 and 33 are selected to be 350 Å, 900 Å 5,000 Å.

Figure 3:
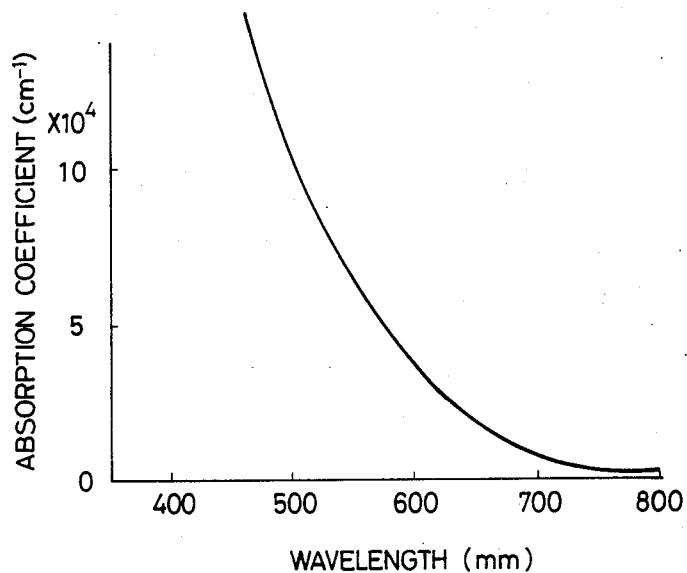
FIG. 3 is a diagram showing reflection spectra of amorphous silicone.

Each of the transparent conductive films 24, 25 and 26 is made of an oxide of indium, tin, or the like and is formed by evaporating. As is well known, an absorption coefficient spectrum of amorphous silicone has a steep curve as shown in FIG. 3 in the visible light area. Therefore, in the arrangement as shown in FIG. 1, in the case where the light 6 is incident through a glass plate 1, the light component in the short wavelength region, that is, blue light, is mainly absorbed in the first semiconductor photoelectric conversion layer 31. The light component in an intermediate wavelength region, that is, green light, is mainly absorbed in the second photoelectric conversion layer 32. Finally, the light component in a long wavelength region, that is, red light, is mainly absorbed in the third photoelectric conversion layer 33. Thus, a signal with respect to a blue color can be determined across the transparent conductive films 24 and 25. Another signal with respect to a green color can be determined across the transparent conductive films 25 and 26, respectively. A signal with respect to a red color can be determined across the transparent conductive film 26 and the metal electrode 4.

Figure 4:
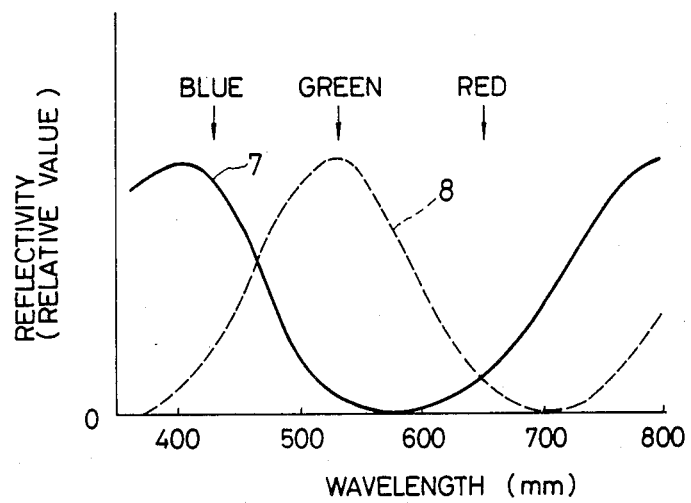
FIG. 4 is a diagram showing reflection spectra at the various thicknesses of the transparent conductive films of the device of FIG. 1.

In order to further improve color resolution according to the present invention, it is effective to cause the transparent conductive film inserted between the semiconductor layers to function as an interference filter. That is, the transparent conductive film 25 reflects blue light so as to cause the semiconductor layer 31 to absorb the blue light while the transparent film 25 allows green and red light to transmit therethrough without reflection. In FIG. 4, a solid line 7 shows the reflection spectrum in the case where the thickness of the transparent conductive film is selected to be 1,400 Å, with the foregoing conditions satisfied.

The transparent conductive film 26 reflects green light and causes the semiconductor layer 32 to absorb green light. In FIG. 4, a dotted line 8 shows a reflection spectrum in the case where the thickness of the transparent conductive film is selected to be 4,000 Å, the foregoing conditions being satisfied.

The transparent conductive film 24 most closely located at the light incident side is required to transmit almost all of the visible light and therefore it is optimum to select the thickness thereof to be about 650 Å, i.e., thinner than the other transparent conductive films. Alternatively, it is possible that all of the semiconductor photoelectric conversion layers 31, 32 and 33 may be selected to have the same thickness. In this instance, color discrimination is performed by utilizing only the differences in reflection characteristics between the transparent conductive films.

Each semiconductor photoelectric conversion layer includes a p-i-n junction of amorphous silicone in the embodiment as described above. It is, however, a matter of course that a p-i-n junction or a Schottky junction of another thin film semiconductor material may be used. Alternatively, a photoconductive material having no junction (for example, a single layer of nonadditive amorphous silicon) may be used.

Moreover, the number of the laminated photoelectric conversion layers may be further increased so as to make it possible to detect blue, green, red, and intermediate colors therebetween. Further, in order to improve resolution, it is effective to perform correction by using an external electronic circuit connected to the electrode, as required.

According to the present invention, the semiconductor photoelectric conversion layers are laminated with the transparent conductive films interposed therebetween, and the respective absorption characteristics of the photoelectric conversion layers or the respective reflection characteristics of the transparent conductive films are made different from one another so that the conversion layer disposed at the light incident side absorbs light in the short wavelength region. The other conversion layers absorb light longer in wavelength as the distance of the conversion layer from the light incident side increases. The photoelectromotive forces generated in the respective layers are represented by signals corresponding to the wavelength regions of absorbed light. Therefore, the respective sensors corresponding to various colors are operated by light which is incident at the same position. No color offset is generated and the density of a picture element can be increased. Accordingly, it is possible to obtain a color photosensitive device having improved resolution and high sensitivity.

What is claimed is:

1. A color photosensitive device comprising:
a transparent substrate; and
a photoelectric conversion device mounted on said substrate. said device comprising a first transparent conductive film laminated on a surface on said substrate, a first photoelectric conversion layer laminated on said first transparent conductive film, a second transparent conductive film laminated on said first photoelectric conversion layer, a second photoelectric conversion layer laminated on said second transparent conductive film, a third transparent conductive film laminated on said second photoelectric conversion layer, a third photoelectric conversion layer laminated on said third transparent conductive film, and an electrode formed on said third photoelectric conversion layer, wherein the thickness of said second photoelectric conversion layer is greater than the thickness of said first photoelectric conversion layer and less than the thickness of said third photoelectric conversion layer for creating said second photoelectric conversion layer having a light absorption coefficient sensitive to a wavelength which is greater than a wavelength to which a light absorption coefficient of said first photoelectric conversion layer is sensitive and less than a wavelength to which a light absorption coefficient of said first photoelectric conversion layer is sensitive and less than a wavelength to which a light absorption coefficient of said third photoelectric conversion layer is sensitive.

2. A color photosensitive device according to claim 1, wherein the thickness of said first photoelectric conversion layer is 350 Å, the thickness of said second photoelectric conversion layer is 900 Å, and the thickness of said third photoelectric conversion layer is 5,000 Å.

3. A color photosensitive device according to claim 1, wherein each of said photoelectric conversion layers comprises amorphous silicone.

4. A color photosensitive device according to claim 1, wherein each of said transparent conductive films comprises an oxide of indium or tin.

5. A color photosensitive device according to claim 1, wherein said substrate comprises a glass plate.

6. A color photosensitive device according to claim 2, wherein said second transparent conductive film reflects light having a wavelength less than a first value and said third transparent conductive film reflects light having a wavelength less than a second value that is greater than said first value.

* * * * *